United States Patent [19]

Epler et al.

[11] Patent Number: 4,962,057
[45] Date of Patent: Oct. 9, 1990

[54] METHOD OF IN SITU PHOTO INDUCED EVAPORATION ENHANCEMENT OF COMPOUND THIN FILMS DURING OR AFTER EPITAXIAL GROWTH

[75] Inventors: John E. Epler, Cupertino; David W. Treat, San Jose; Thomas L. Paoli, Los Altos, all of Calif.

[73] Assignee: Xerox Corporation, Stamford, Conn.

[21] Appl. No.: 257,498

[22] Filed: Oct. 13, 1988

[51] Int. Cl.$^5$ ............... H01L 21/20; H01L 21/26
[52] U.S. Cl. ................. 437/81; 148/DIG. 48; 148/DIG. 51; 148/DIG. 71; 148/DIG. 94; 148/DIG. 135; 156/613; 427/53.1; 437/173; 437/935; 437/936; 437/970; 437/974
[58] Field of Search ............... 148/DIG. 48, 51, 56, 148/65, 71, 94, 110, 95, 135, 169; 156/610-615, 643, 644, 662; 427/53.1, 252, 255.1; 437/81, 82, 105, 107, 173, 247, 935, 936, 943, 947, 970, 974

[56] References Cited

U.S. PATENT DOCUMENTS

| | | |
|---|---|---|
| 4,044,222 | 8/1977 | Kestenbaum ............... 219/121 L |
| 4,288,528 | 9/1981 | Picquendar et al. ............ 430/297 |
| 4,333,226 | 6/1982 | Abe et al. ............... 437/24 |
| 4,388,517 | 6/1983 | Schulte et al. ............ 219/121 LJ |
| 4,571,486 | 2/1986 | Arai et al. ............... 437/173 |
| 4,624,736 | 11/1986 | Gee et al. ............... 427/53.1 |
| 4,645,687 | 2/1987 | Donnelly et al. ............ 427/53.1 |
| 4,685,776 | 8/1987 | Schachameyer et al. ....... 437/173 |
| 4,705,593 | 11/1987 | Haigh et al. ............... 156/635 |
| 4,748,132 | 5/1988 | Fukuzawa et al. ........... 437/173 |
| 4,759,030 | 7/1988 | Murayama et al. ........... 372/44 |
| 4,782,035 | 11/1988 | Fujiwara ............... 156/613 |
| 4,828,874 | 5/1989 | Hiraoka et al. ............ 427/53.1 |
| 4,843,030 | 6/1989 | Eden et al. ............... 437/88 |
| 4,843,031 | 6/1989 | Ban et al. ............... 437/129 |

OTHER PUBLICATIONS

Reep et al., "Electrical Properties of Organometallic Chemical Vapor Deposited GaAs Epitaxial Layers", Journal of the Electrochemical Society, vol. 131(11), pp. 2697-2702, Nov., 1984.

Foxon et al., "The Evaporation of GaAs Under Equilibrium and Non-Equilibrium Conditions Using a Modulated Beam Technique", Journal of Physical Chemistry and Solids, vol. 34, pp. 1693-1701 (1973).

Fischer et al., "Incorporation Rates of Gallium and Aluminum on GaAs During Molecular Beam Epitaxy at High Substrate Temperatures", Journal of Applied Physics, vol. 54(5), pp. 2508-2510, May, 1983.

(List continued on next page.)

Primary Examiner—Brian E. Hearn
Assistant Examiner—William Bunch
Attorney, Agent, or Firm—W. Douglas Carothers, Jr.

[57] ABSTRACT

In situ evaporation of selected surface regions or layers of compound semiconductors is accomplished without breaking the growth system environment employing photo induced evaporation enhancement in chemical vapor deposition epitaxy. Intense radiation from an energy source desorbs or causes evaporation of consecutive monolayers of atoms or combined atoms from the surface crystal by thermal evaporation. The desorbed atoms from the growth surface are removed atomic layer by atomic layer in a fairly uniform and systematic manner and may be characterized as "monolayer peeling" resulting in a morphology that is sculpturally smooth and molecularly continuous. In this sense, the method of this invention is analogous to erasing or the etching of crystal material and is the antithesis to laser deposition patterning wherein erasure after growth or reduced rate of growth during growth provide "negative growth patterning". In principal, then, this patternable negative growth process is coupled with a positive growth process for providing selective thinning regions of semiconductor layers in three dimensional crystal structures limited only by the functional capabilities of the growth reactor. Selective monotonic increasing and decreasing film thickness in situ can be accomplished while beam illumination remains stationary for a predetermined period of time with exposure of the growth surface accomplished through a patterned mask or, alternatively, while the beam spot or multiple beam spots are modulated and scanned across the growth surface of the film.

11 Claims, 11 Drawing Sheets

OTHER PUBLICATIONS

VanHove et al., "Mass-Action Control of AlGaAs and GaAs Growth in Molecular Beam Epitaxy", *Applied Physics Letters*, vol. 47(7), pp. 726–728, Oct. 1, 1985.

T. Kojima et al, "Layer-By-Layer sublimation Observed by Reflection High-Energy Electron Diffraction Intensity Oscillation in a Molecular Beam Epitaxy System", *Applied Physics Letters*, vol. 47(3), pp. 286–288, Aug. 1, 1985.

R. Heckingbottom, "Thermodynamic Aspects of Molecular Beam Epitaxy: High Temperature Growth in the GaAs/Ga1-xAlxAs System", *Journal of Vacuum Science and Technology B, vol. 3(2), pp. 572–575, Mar.-/Apr., 1985.*

W. D. Goodhue et al, "Planar Quantum Wells with Spatially Dependent Thicknesses and Al Content", *Journal of Vacuum Science and Technology B*, vol. 6(3), pp. 846–849, May/Jun. 1988.

H. Tanaka et al, "Single-Longitudinal-Mode Self Aligned AlGa(As) Double-Heterostructure Lasers Fabricated by Molecular Beam Epitaxy", *Japanese Journal of Applied Physics*, vol. 24, pp. L89–L90, 1985.

A. C. Warren et al, "Masked, Anisotropic Thermal Etching and Regrowth for in Situ Patterning of Compound Semiconductors", *Applied Physics Letters*, vol. 51(22), pp. 1818–1820, Nov. 30, 1987.

F. Micheli and I. W. Boyd, "Laser Microfabrication of Thin Films: Part Three", *Optics and Laser Technology*, vol. 19(2), pp. 75–82, Apr., 1987.

R. Srinivasan entitled, "Kinetics of the Ablative Photodecomposition of Organic Polymers in the Far Ultraviolet (193 nm)", *Journal of Vacuum Science and Technology B*, vol. 1(4), 923–926, Oct./Dec., 1983.

F. Micheli and I. W. Boyd, "Laser Microfabrication of Thin Films: Part One", *Optics and Laser Technology, vol. 18(6), pp. 314–331, Dec., 1986.*

F. Micheli and I. W. Boyd, "Laser Microfabrication of Thin Films: Part Two", *Optics and Laser Technology*, vol. 19(1), pp. 19–25, Feb., 1987.

G. Koren, "Emission Spectra and Etching of Polymers and Graphite Irradiated by Excimer Lasers", *Journal of Applied Physics*, vol. 56(7), pp. 2120–2126, Oct. 1, 1984.

Kuleimoto et al., "Selective Area Control . . . in Laser-Assisted MOVPE of GaAs and AlGaAs," J. Crys. Growth, 77(1986), pp. 223–228.

Bedair et al., "Laser Selective Deposition of III-V Compounds an GaAs and Si Substrates," J. Crys. Growth, 77 (1986), pp. 229–234.

METHOD OF IN SITU PHOTO INDUCED EVAPORATION ENHANCEMENT OF COMPOUND THIN FILMS DURING OR AFTER EPITAXIAL GROWTH

GOVERNMENT RIGHTS

The Government has certain rights in this invention pursuant to Contract No. 86F173100 awarded by the Defense Advanced Research Projects Agency (DARPA).

CROSS-REFERENCE TO RELATED APPLICATIONS

This application contains subject matter that is related to subject matter of U.S. patent application Ser. No. 07/328,988, filed Mar. 24, 1989, and U.S. patent application Ser. No. 07/328,275, filed Mar. 24, 1989, both assigned to the same assignee herein and are incorporated herein by reference thereto.

BACKGROUND OF THE INVENTION

This invention relates generally to the vapor deposition of thin films and more particularly to a method of changing or modifying in situ the geometrical structure of a semiconductor device in epitaxial growth or during an interruption in epitaxial growth via chemical vapor deposition (CVD) and more specifically to a method of in situ, radiation assisted evaporation or desorption or vaporization (hereinafter referred to as "photo induced evaporation enhancement") of patterned or selected volumes of surface crystal material from a single element film (e.g., Si or Ge) or a binary, ternary and other compound semiconductor thin films, such as, II-VI or III-V compounds (e.g., ZnSe or GaAs) or alloys (e.g. $Al_xGa_{1-x}As$), principally after their epitaxial crystal growth, but also during their epitaxial crystal growth, in vapor phase epitaxy (VPE) or metalorganic chemical vapor deposition (MOCVD) or molecular beam epitaxy (MBE).

In U.S. patent application Ser. No. 07/177,563, filed Apr. 4, 1988, incorporated herein by reference thereto, there is disclosed a method of in situ stoichiometric and geometrical photo induced modification to compound semiconductor films. Disclosed in this application is the use of a scanned laser beam across or exposure of radiation through a mask to a growth surface to enhance the growth rate of epitaxial deposition in MOCVD. Variations in beam intensity, beam size, beam dwell time, or possibly changes in wavelength, if a tunable laser, via scanning or mask exposure, etc., at selected regions of the growth surface will selectively enhance the growth rate and/or in situ stoichiometric content during the deposition of a film on the growth surface. Such changes can produce individual films in situ having varying thicknesses and stoichiometric content useful in varying the electrical (e.g., bandgap or quantum size effect) and optical (e.g., refractive index or waveguiding) characteristics of the film in fabricating semiconductor devices.

As demonstrated in Ser. No. 07/177,563, changes in growth rate are accomplished by varying the growth surface temperature via changes in beam intensity or power density or substrate temperatures or combinations thereof. As is evident from FIG. 5 in Ser. No. 07/177,563, which illustrates the growth rate and photo induced growth rate enhancement of GaAs and AlGaAs as a function of substrate temperature, $T_s$, changes in substrate temperatures at different growth surface locations can be brought about by different laser beam intensity exposures through a mask, or via beam scanning in relationship to dwell time, so that different growth rate enhancements can be achieved at different growth surface locations resulting in different film thicknesses or stoichiometric content at those different locations. In FIG. 5 of that application, laser enhanced growth of AlGaAs is observed to increase for substrate temperatures, $T_s$, less than 610° C. and the laser enhanced growth of the GaAs is observed to increase for substrate temperatures less than 565° C.

To this extent, the process of that application provides a growth regime during in situ growth wherein different growth rate enhancements may occur at selected growth surface locations during film deposition due to different temperatures of operation thereby producing different locations in the same film having different film thicknesses. A specific example of this is represented in the data of FIG. 5 of that application wherein at one location of the growth surface, a smaller growth rate enhancement is achieved due to lower temperatures of operation, e.g., the absence of laser illumination over substrate temperature, compared to another location of the growth surface wherein larger growth rate enhancement is achieved due to higher temperature of operation, e.g. the presence of laser illumination in addition to substrate temperature at a selected growth surface location. The first mentioned location, therefore, results in smaller film thickness, as well as possibly stoichiometric changes, compared to the second mentioned location.

The selective variance of growth rate enhancements in different regions of the epitaxially grown film, varying in situ the geometry, bandgap, refractive index properties and other electrical and optical characteristics of films is also possible, with sufficient optical intensity, at substrate temperatures greater than substrate temperatures illustrated for growth rate enhancement in FIG. 5 in patent application Ser. No. 07/177,563. This effect is made possible by the exponential dependence of evaporation rate with temperature and the concomitant limiting effect upon growth rate. For the particular example in the case of GaAs, see FIG. 2 in the article of D. H. Reep et al, "Electrical Properties of Organometallic Chemical Vapor Deposited GaAs Epitaxial Layers", *Journal of the Electrochemical Society*, Vol. 131(11), pp. 2697-2702, Nov. 1984.

It is a principal object of this invention to provide such a desorption regime wherein the rate of evaporation of deposited constituents is greatly enhanced either during the growth of the film to decrease the effective growth rate or after film growth to provide, in either case, locations in the film of reduced thickness compared to other regions of the film. This desorption regime is termed herein as "photo induced evaporation enhancement".

Photo induced evaporation processes known in the art for the removal of material may be generally classified as either photothermal or photochemical evaporation. An example of photothermal evaporation is found in U.S. Pat. No. 4,388,517 wherein patterning can be achieved in a deposited metal overlayer by employing therebeneath an insulating underlayer of low thermal conductivity that is patterned prior to the metal overlayer deposition to reveal or expose regions of a base film therebeneath of high thermal conductivity. The exposure to high intensity radiation, such as a laser beam, will cause sublimation of the deposited metal overlayer in deposited regions over low thermal conductivity while those regions of the metal overlayer over patterned high thermal conductivity regions of the base layer will remain intact thereby forming a metallized overlayer pattern matching that formed in insulating underlayer. Large optical power densities (0.5 to 5 joules/cm$^2$) are employed in order to effectively remove metal layers 10 nm thick and, in essence, entails a process of mask making rather than a process of patterned negative crystal growth.

Furthermore, studies have been conducted relative to the thermal evaporation of compound semiconductors, such as the congruent evaporation of GaAs, under equilibrium and nonequilibrium conditions. See, as an example, C. T. Foxon et al, "The Evaporation of GaAs Under Equilibrium and Nonequilibrium Conditions Using a Modulated Beam Technique, *Journal of Physical Chemistry and Solids*, Vol. 34, pp. 1693-1701 (1973). A decrease in the net growth rate of GaAs in MBE above 640° C. was observed by R. Fischer et al, "Incorporation Rates of Gallium and Aluminum on GaAs During Molecular Beam Epitaxy at High Substrate Temperatures", *Journal of Applied Physics*, Vol. 54(5), pp. 2508-2510, May, 1983, which was attributed to Ga evaporation. Also, those knowledgeable in the area of thermal evaporation have studied the layer-by-layer growth and desorption of GaAs and AlGaAs observing that the growth rates as well as the sublimation or evaporation rates for these compounds in a MBE high vacuum system is a function of substrate temperature and the impinging arsenic flux. See the articles of J. M. Van Hove et al, "Mass-Action Control of AlGaAs and GaAs Growth in Molecular Beam Epitaxy", *Applied Physics Letters*, Vol. 47(7), pp. 726-728, Oct. 1, 1985 and T. Kojima et al, "Layer-By-Layer sublimation Observed By Reflection High-Energy Electron Diffraction Intensity Oscillation in a Molecular Beam Epitaxy System", *Applied Physics Letters*, Vol. 47(3), pp. 286-288, Aug. 1, 1985. The results were in quantitative agreement with the mass-action analysis of R. Heckingbottom, "Thermodynamic Aspects of Molecular Beam Epitaxy: High Temperature Growth in the GaAs/-Ga$_{1-x}$Al$_x$As System", *Journal of Vacuum Science and Technology* B, Vol. 3(2), pp. 572-575, Mar./Apr., 1985.

Further, techniques in MBE processing using thermal evaporation have been employed to provide a pattern in heterostructures. In one case, a plurality of GaAs quantum well layers separated by AlGaAs barrier layers were grown in MBE on a GaAs substrate mounted on a slotted susceptor so that a temperature differential is established across the supported substrate. In this manner, the thickness of the deposited GaAs and AlGaAs layers would be thinner over deposited regions on firm substrate having a 30° C. to 50° C. higher temperature gradient over substrate temperature compared to adjacent regions over susceptor recesses. See W. D. Goodhue et al, "Planar Quantum wells With Spatially Dependent thicknesses and Al Content", *Journal of Vacuum Science and Technology* B, Vol. 6(3), pp. 846-849, May/June 1988. It was recognized that quantum well structures grown above 700° C., the thickness of these alternating well/barrier layers decreases as the temperature increases.

In the other case, represented by two examples, patterning is achieved by quasi-in situ thermal processing wherein thermal etching is employed to selectively remove GaAs. In one example, a n-GaAs layer over a p-AlGaAs layer is initially, selectively chemically etched in a particular region followed by thermal etching to remove the remaining thin GaAs left from chemical etching before proceeding with regrowth of the p-AlGaAs layer. This forms a buried reverse biased current confinement mechanism in a double heterostructure laser. H. Tanaka et al, "Single-Longitudinal-Mode Self Aligned AlGa(As) Double-Heterostructure Lasers Fabricated by Molecular Beam Epitaxy", *Japanese Journal of Applied Physics*, Vol. 24, pp. L89-L90, 1985. In the other example, a GaAs/AlGaAs heterostructure partially masked by a metallic film is thermally etched in an anisotropic manner illustrating submicron capabilities for device fabrication. A. C. Warren et al, "Masked, Anisotropic Thermal Etching and Regrowth for In Situ Patterning of Compound Semiconductors", *Applied Physics Letters*, Vol. 51(22), pp. 1818-1820, Nov. 30, 1987. In both of these examples, AlGaAs masking layers are recognized as an etch stop to provide for the desired geometric configuration in thermally etched GaAs, although it is also known that, given the proper desorption parameters, AlGaAs may also be thermally etched at higher temperatures and different attending ambient conditions vis a vis GaAs.

However, none of these evaporation/desorption techniques employ photo induced evaporation as a technique in a film deposition system to incrementally reduce, on a minute scale, film thickness in patterned or selective locations at the growth surface either during or after film growth, producing smooth sculptured surface morphology which is a principal objective of this invention.

As to photochemical processes, there is a large area of art relating to photochemical or photoetching techniques relating to the chemical or ablative removal of materials from film surfaces or regions referred to as "laser microchemical processing" and disclosed in the article of F. Micheli and I. W. Boyd, "Laser Microfabrication of Thin Films: Part Part Three", *Optics and Laser Technology*, Part Three: Vol. 19(2), pp. 75-82, Apr., 1987. One such process referred to in this article is called ablative photodecomposition (APD) and is detailed in the article of R. Srinivasan entitled, "Kinetics of the Ablative Photodecomposition of Organic Polymers in the Far Ultraviolet (193 nm)", *Journal of Vacuum Science and Technology* B, Vol. 1(4), 923-926, Oct./Dec., 1983. Such photochemical and ablative type processes should not be confused with the invention herein, as this invention deals predominantly with a process that photothermally desorbs or evaporates material from a film surface as opposed to processes referenced above that deal predominantly with photochemical or photo-ablative removal of material from a film surface. While the process herein may possibly involve some photochemical efforts, the predominant effect in the execution of the method of this invention is photothermal evaporation.

Other objects of this invention are to bring about in situ evaporation of selected surface regions or layers of compound semiconductors without breaking the growth system environment employing photo induced evaporation enhancement in chemical vapor deposition epitaxy and, further, to apply this method in the fabrication of semiconductor devices, such as multiple wavelength light emitting semiconductor lasers or laser arrays, buried heterojunction lasers and laser arrays, and laser devices with buried back biased junctions for current confinement as further disclosed in U.S. patent application Ser. No. 07/328,988 and devices with buried impurity induced disordering sources as disclosed in U.S. patent application Ser. No. 07/328,275.

SUMMARY OF THE INVENTION

According to this invention, in situ removal or thinning of portions or all of selected regions of deposited films is accomplished by employing an irradiation energy source directed to a spot or region of exposure on the growth surface of a substrate or support in a chemical vapor deposition reactor system, e.g., a MOCVD system. Since the method here is an in situ technique, the growth surface is never exposed to an undesirable or foreign environment between the formation of successive film layers. The energy source may, as an example, be an Ar+ laser beam, a YAG laser beam, $CO_2$ laser beam, or excimer laser beam, a high power lamp or a combination of the foregoing. Gaussian profile spot intensity variations or variations in the intensity of the source spot at selected regions at the growth surface will selectively enhance the evaporation of crystal deposit at selected locations on the growth surface after growth or selectively reduce the growth rate of crystal deposit at selected locations on the growth surface during growth given proper beam intensity and power and system temperature. The intense radiation from the energy source desorbs or causes evaporation of consecutive monolayers of atoms or combined atoms from the surface crystal principally by thermal evaporation, although possibly minimally supplemented photochemically depending upon the photon energy of the surface and the molecular bond strengths of the crystal and the presence of a gaseous environment. An important characteristic of the method of this invention is that the desorbed atoms from the growth surface are not removed in clumps or fragments but remove atomic layer by atomic layer in a fairly uniform and systematic manner and may be characterized as "monolayer peeling" resulting in a morphology that is sculpturally smooth and molecularly continuous. In this sense, the method of this invention is analogous to erasing or the etching of crystal material as opposed to depositing crystal material, and is the antithesis to laser deposition patterning where erasure after growth or reduced rate of growth during growth provide negative growth patterning.

In principal, then, a patternable negative growth process is coupled with a positive growth process for providing selective thinning regions of semiconductor layers in three dimensional crystal structures limited only by the functional capabilities of the growth reactor. Selective monotonic increasing and decreasing film thickness can be accomplished while beam illumination remains stationary for a predetermined period of time with exposure of the growth surface accomplished through a patterned mask or, alternatively, while the beam spot or multiple beam spots are modulated and scanned across the growth surface. The changes or variations in film thickness produced by the method of this invention are useful in fabricating semiconductor devices having regions of different geometrical, electrical and optical properties produced in situ in one or more semiconductor layers of such devices. In particular, the precise control provided by photo induced evaporation enhancement permits reproducible control and yields in the selection of desired regional area thicknesses of semiconductor layers or film of semiconductor devices and the accurate changes in the quantum size effects of thin layers for semiconductor devices, such as, for example, multiple wavelength laser arrays with emitters having different preselected individual operating wavelengths.

One would suspect or predict that employing any evaporation technique in situ during or after film growth in CVD that uses the intense heat from a laser beam to photothermally heat the surface regions of the growth surface to induce molecular evaporation or vary the evaporation rate of molecular constituents from the surface of the film would produce a roughened surface or abrupt material interfaces and cause damage to the lattice structure. However, it turns out that this is not correct when following the teachings of this invention.

Other objects and attainments together with a fuller understanding of the invention will become apparent and appreciated by referring to the following description and claims taken in conjunction with the accompanying drawings.

DETAILED DESCRIPTION OF THE PREFERRED EMBODIMENTS

Figures 1, 1A:
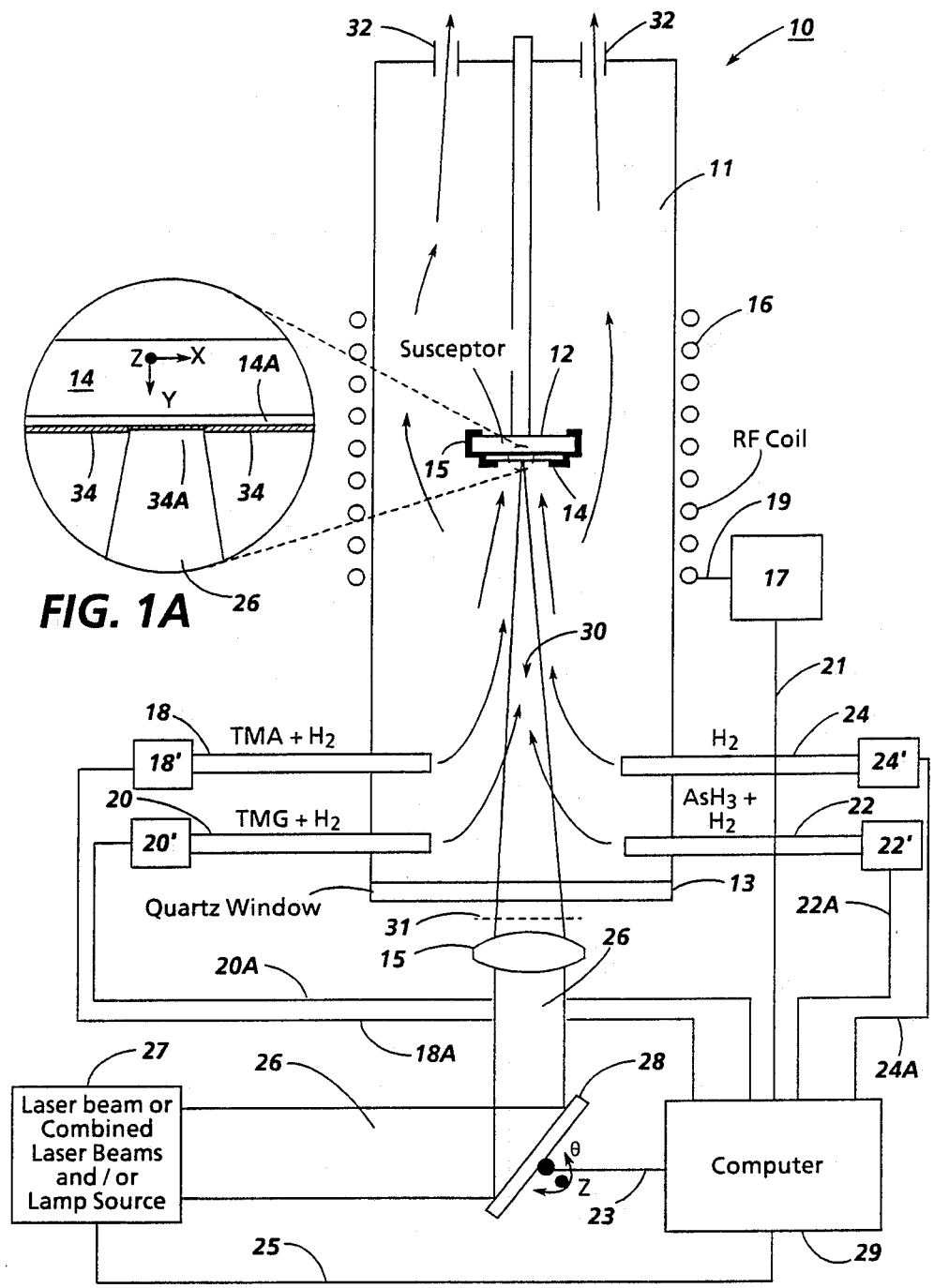
FIG. 1 is a schematic illustration of a MOCVD reactor system utilized in the practice of this invention.

Reference is now made to FIG. 1 wherein there is shown a schematic diagram of a MOCVD system 10 comprising a laser assisted growth chamber 11 used for MOCVD processing in the practice of this invention. Chamber 11 may be a quartz tube which includes a transparent quartz window 13 at its bottom with a graphite susceptor 12 suspended in chamber 11 on which a substrate or support 14 is held with a quartz supporting ring. The exposed downward facing surface of substrate 14 is termed the growth surface. Susceptor 12 is inductively heated with an external RF coil 16 connected by line 19 to RF controller 17 which is connected by line 21 to computer 29 to selectively vary, under programmed control, the temperature environment at the growth surface of substrate 14. Gas inlets 18, 20, 22 and 24 are located near the bottom of chamber 11 to provide for inlet, respectively, of sources of the gases trimethyl-aluminum (TMA), trimethyl-gallium (TMG), $AsH_3$, and $H_2$ as a carrier gas. These sources may also include dopants such as $H_2Se$. The flow rate, volume and composition of these source gases are maintained under programmed control by computer 29 via control lines 18A, 20A, 22A and 24A to gas sources 18', 20', 22', and 24'. These gases are mixed in the vicinity of inlets 18, 20, 22 and 24 at 30 and immediately flow upwardly in chamber 10, as indicated by the arrows in FIG. 1, and eventually exit the chamber at exit ports 32. The upward flow of the gas mixture prevents wall deposits on the bottom half of chamber 11.

The growth conditions for conventional MOCVD are observed and are well documented in the prior art. The gas mixture proceeds upwardly through chamber and a portion of the gases contact the major growth surface of substrate 14 and the metallic atoms condense or decompose from the reactant gas compounds on the growth surface as an epitaxially deposited film, e.g., GaAs when source 18 is shut off via computer 29, or GaAlAs when all sources 18, 20, 22 and 24 are in operation via computer 29.

The design of this MOCVD system provides clear optical access for a CW or pulsed radiation beam or beams 26, 26A and 26B from energy source 27 through quartz window 13 and focused via objective lens 15 onto the growth surface of substrate 14. Beam 26 may be comprised of one or more types of light energy sources to bring about photothermal evaporation, such as, a high intensity mercury or xenon lamp source, a $CO_2$ laser, an Ar+ laser, YAG laser, excimer laser, and also a high power solid state laser (e.g., 30 mW-5W) or the like. Source 27 may, therefore, be a laser or combination of lasers or combination laser and high intensity lamp producing a high power output beam 26. In the case of solid state lasers, power requirements can be increased in a single emitter by focussing down the spot size to increase intensity or by utilizing the additive power in the far field of several emitters in a phase locked laser array in combination focussing down the spot size to increase intensity.

In the case of lamp sources or a laser beam source with a large waist, the growth surface of substrate 14 is exposed with a high intensity blanket illumination through a mask 31 having a predetermined pattern to selectively expose regions of the growth surface and provide photo assist evaporation in those regions. Also, it is preferred that the lamp source be a rapid pulse source in order to obtain peak power output.

In the case where source 27 is a laser, laser beam 26 may be, for example, focused to a 1.0 mm spot size and focused on the growth surface of substrate 14 during the growth of the GaAs and GaAlAs layers of material. Laser beam 26 may be scanned via scanner 28, illustrated as a galvanometer-controlled turning mirror. The laser spot may, for example, be slightly "vibrated" by galvanometer-controlled turning mirror 28 to spatially average any nonuniformity in optical intensity profile of beam 26, which is generally of Gaussian profile. Mirror 28 may, alternately, be a rotating polygon. Mirror 28 may be operated by $\theta$ rotation to scan in the X direction and moved laterally in the Z plane to scan in the Z direction to obtain orthogonal beam scanning in the X-Z plane. Instead of mirror 28, two galvanometer-controlled turning mirrors may be utilized to obtain orthogonal scanning in the X-Z plane. Such a scanning system is manufactured by General Scanning, Inc., 500 Arsenal Street, Watertown, MA 02172. Further, scanner 28 may alternatively be a X-Z raster scan system with a rapid refresh rate.

Laser 27 and scanner 28 are operated under computer programmed control via computer 29 wherein the beam intensity and beam ON and OFF states may be modulated via control line 25 to source 27 and the X-Z pattern or path of scan of the beam spot on the growth surface at substrate 14 is controlled via control line 23 to scanner 28.

The inset in FIG. 1 is an enlargement of a region of substrate 14 including the point of focus of beam 26 onto the substrate growth surface. As shown in the inset, substrate 14 may be first provided with a prelayer 14A of GaAs or GaAlAs followed by the deposit of film 34 of GaAs or GaAlAs. As depicted in the FIG. 1 inset for the case of a GaAs deposited film, if beam 26 of proper intensity and power density, accompanied with proper substrate temperature at susceptor 12 and desired TMA gas transport ratio, [TMA]/([TMA]+[TMG]), the irradiated regions of film 34 of focused beam 26 will experience a lower overall film growth rate than adjacent unirradiated regions of film 34 or experience a desorption effect and evaporation of elemental constituents after growth of film 34, which experiences are represented by thinner region 34A of film 34. Thus, with proper conditions present, region 34A illuminated by beam or beams 26, 26A and 26B will bring about either a reduced growth rate or evaporation of GaAs, what ever the case may be, in region 34A. In particular, after the growth of film 34, if beam 26 of proper intensity and power density, accompanied with an appropriate gaseous environment and gas transport ratio and substrate temperature, irradiated regions of film 34 will experience a thinning or removal of molecular monolayers of previously grown crystal material as represented by thinner region 34A.

Figure 2:
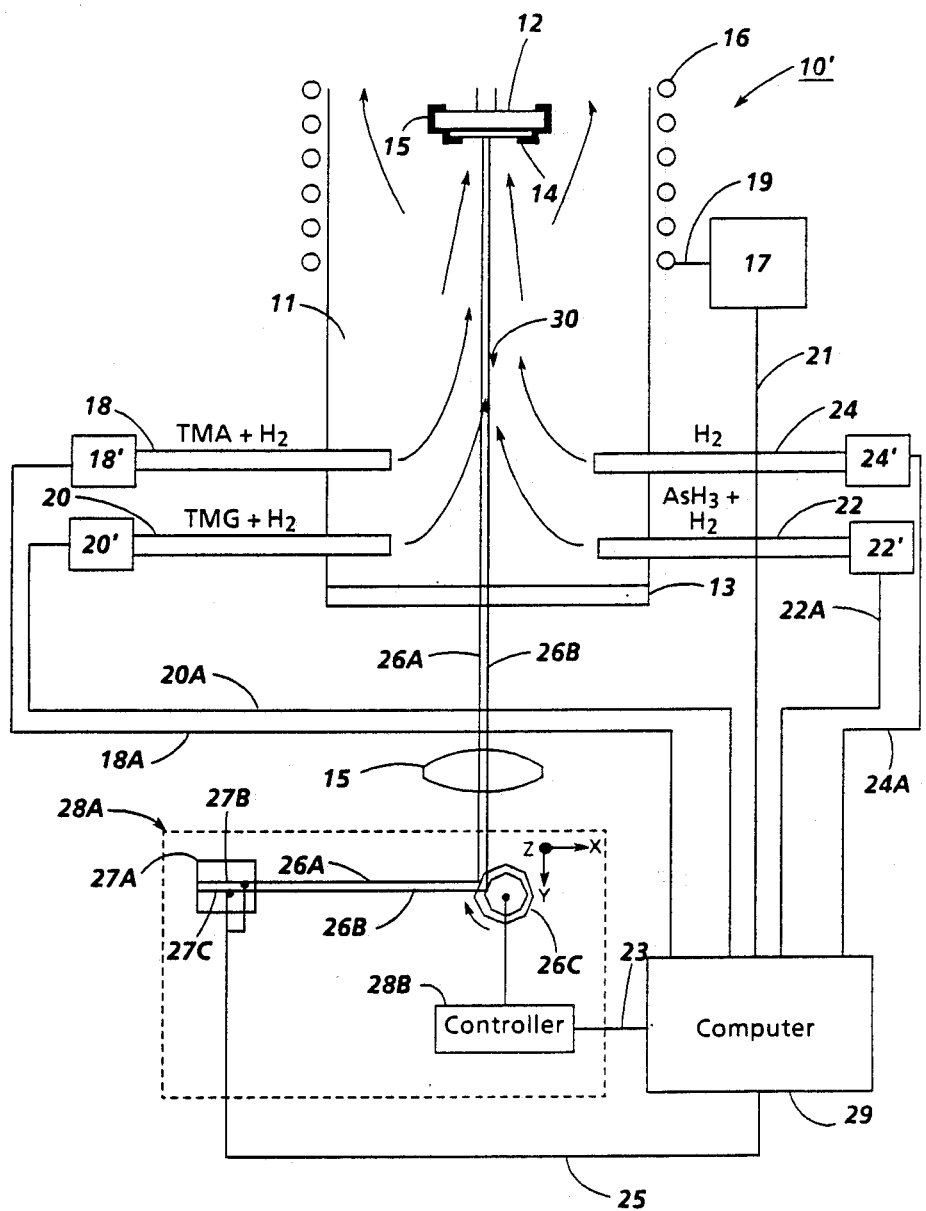
FIG. 2 is a schematic illustration of another MOCVD reactor system that may be utilized in the practice of this invention.

To facilitate growth surface scanning, more than one beam may be focused to and scanned across the substrate surface. Multiple beam scanning may be provided with multiple beam sources or employing a beam splitter to produce multiple beams so that simultaneous exposure of different surface regions of substrate 14 may be accomplished at the same or different beam intensities and/or at the same or different dwell times at such regions. An example of a multiple split-beam system is shown in U.S. Pat. No. 4,762,402. An example of multiple beam sources is shown in FIG. 2 wherein system 10' includes a dual beam, solid state laser System 10' includes identical components in system 10, disclosed in FIG. 1, and, therefore, are shown with the same numerical identifiers and the description thereof is equally applicable to FIG. 2. System 10' is basically the same except for the arrangement of scanner 28A comprising semiconductor laser array 27A having, for example, two emitters 27B and 27C which provide, respectively, beams 26A and 26B directed onto a mirror faceted polygon 26C (shown as two polygons with one larger than the other for purposes of individual identity of the two scanned beams, although such a double polygon is also an optically operative alternative). While laser array 27A is shown having dual emitters, it is within the scope of this embodiment to provide a laser array with several emitters and output beams for scanning simultaneously onto the growth surface of substrate 14. The advantage in the use of a diode laser is its small size that permits easy optical access and alignment for use in conjunction with chamber 11.

Control of rotational velocity or incremental movement of scanner 28A is accomplished by computer 29 via scanner controller 28B in conjunction with modulation of emitters 27B and 27C of laser array 27A. In this connection, computer 29 is coupled to controller 28B via cable 23 and coupled to laser array 27A via lines 25. Controller 28B includes a scanner motor rotating or incrementing the rotational movement of polygon 26C to scan beams 26A and 26B in the X direction across substrate 14 as well as an indexing mechanism to increment the scanning polygon 26C laterally in the Z direction. In this connection, beams 26A and 26B are folded by the facet mirrors of scanner 28A, focussed via lens 15 for formation of beam spots at the growth surface and scanned in the X plane across the growth surface of substrate 14. Scanner 28A also may be rapidly indexed in the Z direction into and out of the plane of FIG. 2 in order to provide other scan paths across substrate 14 in the X direction. Computer 29 is programmed to modulate the intensity and power of laser array 27A to meet the necessary level of photothermal evaporation requirements and resultant evaporative effects desired at the growth surface for locations thereon being addressed, while simultaneously controlling the rotational velocity and Z direction indexing of scanner polygon 26C to provide the desired beam dwell time for each such surface location. Such rotational scanning could, therefore, be accomplished either incrementally or continuously depending on the desired application or desired dwell period with repetitive scanning operations carried out over the entire growth surface of substrate 14 during film growth.

Figure 3:
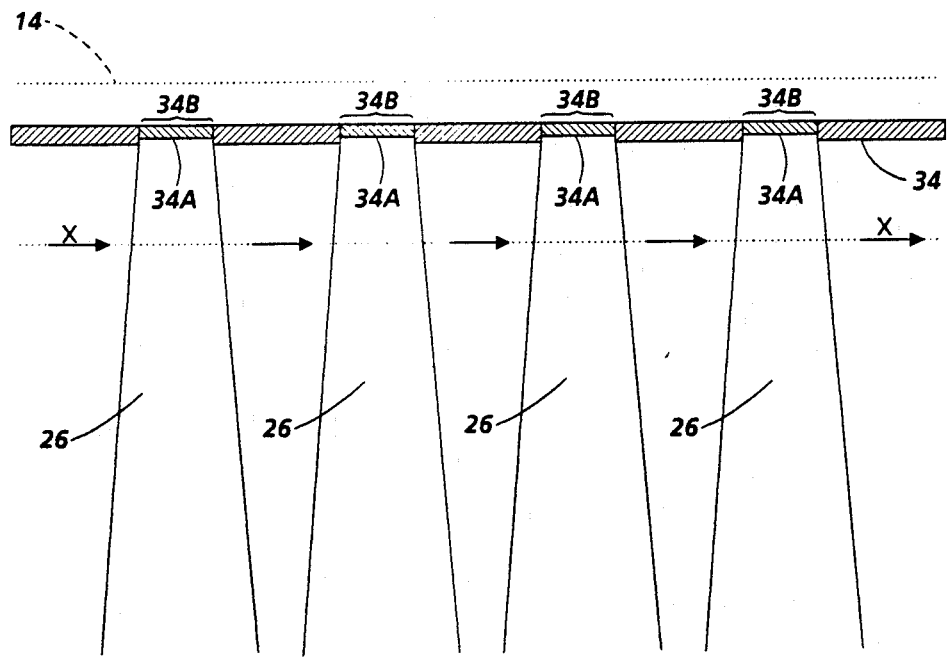
FIG. 3 is a schematic illustration of laser beam spot as the same is modulated and scanned across the growth surface to selectively photo induce evaporation.

FIG. 3 schematically illustrates an example of an operation conducted either in connection with scanner 28 or 28A for the photo induced evaporation enhancement of selected regions of film 34. In FIG. 3, beam 26 or beams 26A and 26B (not shown) are incremented or continuously scanned in the X direction with a predetermined dwell time-ON beam at selected locations 34B permitting photo induced evaporation enhancement of surface monolayers of GaAs, for example, to produce consecutive thinner regions 34A in film 34 in the X direction extent of substrate 14. The formation of regions 34A is accomplished with a beam dwell time sufficient to produce the desired depth of film thinning or by continuously repeated scanning of the entire substrate surface with beam ON times at each location 34B being carried out until the desired depth of film thinning is achieved.

Figure 4:
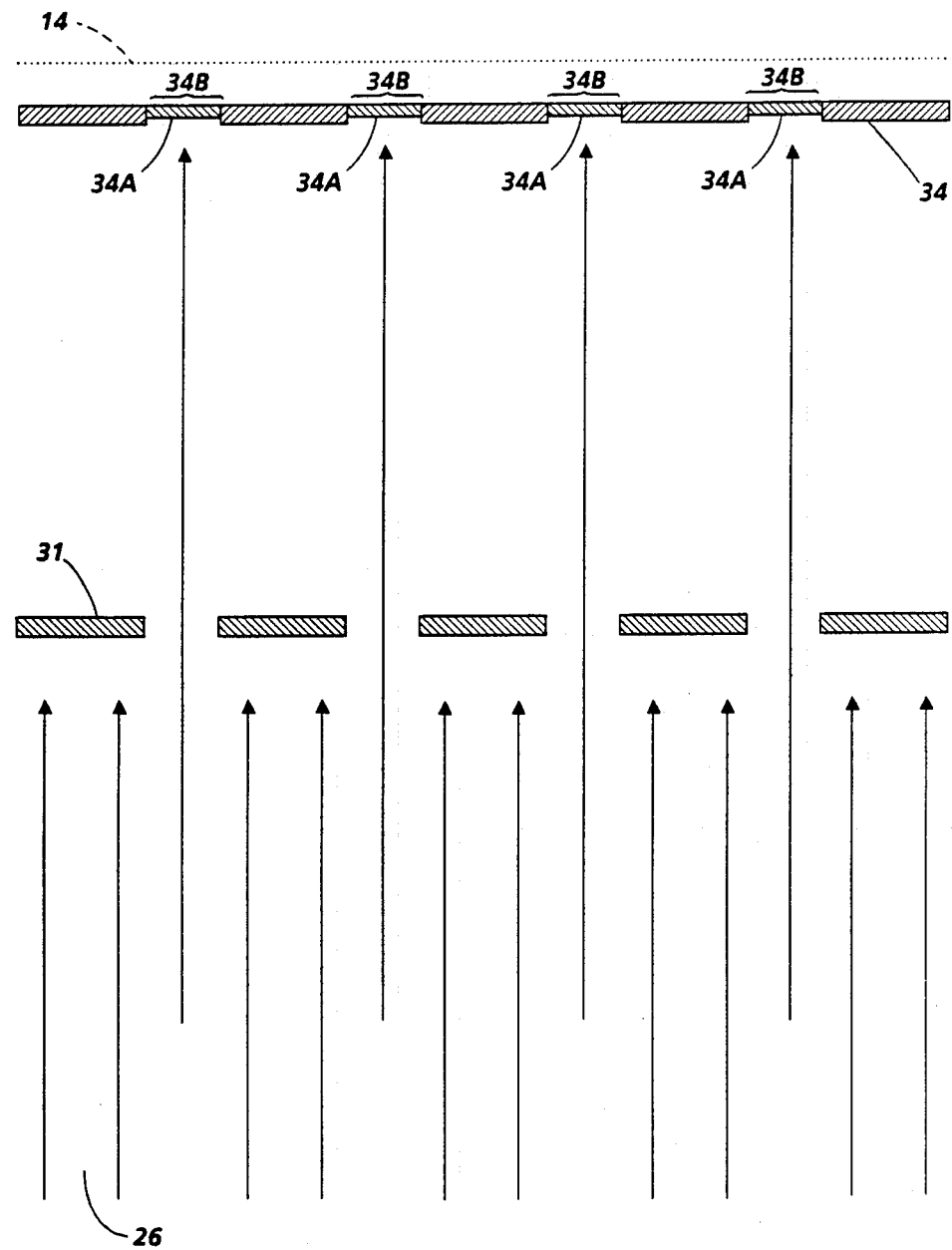
FIG. 4 is a schematic illustration of beam illumination with exposure of the growth surface accomplished through a patterned mask to selectively photo induce evaporation.

FIG. 4 schematically illustrates an example of an operation conducted in connection with a stationary beam and/or lamp exposure indicated at 26 through apertures of mask 31 to cause photo induced evaporation of GaAs monolayers, for example, at locations 34B. Beam dwell time is sufficient to produce the desired depth of film thinning, via photo induced evaporation enhancement, as indicated at regions 34A.

As an alternative, a mask without any apertures may be employed at 31 and slowly moved out of or into position of cover exposure of beam 26 so that a monotonic increase or decrease in film thickness can be achieved across the film surface produced by the evaporation gradient and time exposure produced by the laterally moving mask. This is one particular technique for fabricating the monotonically inclined surface illustrated in FIG. 11.

In the cases of all of the aforementioned beam type scanners, the refresh rate of the scanner should be as fast as the growth rate processes occurring at the growth surface, which growth rate may be several times a second or more relative to MOCVD system 10, and would require about five times or more complete sweeps per second of the growth surface of a conventional substrate wafer. Evaporation enhancement has a slower processing rate since small changes in processing temperature brought on by source 27 in combination with the existing substrate temperature, $T_s$, may yield large changes in surface evaporation at the growth surface.

Experiments with the selective photothermal evaporation of regions after their epitaxial growth illustrate that at temperatures in excess of 825° C., in particular around 1000° C. and more in an attending environment, produced by a focussed 3 mm laser beam with a power of about 5 W, an evaporation rate for GaAs can be achieved of 1 Å per second or removal of an atomic monolayer of material at the surface spot every four seconds. The evaporation rate may be varied from about 1 Å per second to about 10 Å per second depending upon the operating temperatures at the substrate ($T_S$) and of the beam spot ($T_L$) and the particular material, GaAs or AlGaAs, for example. In any case, the operating temperature for AlGaAs will be higher than that for GaAs because the Al content in AlGaAs causes a slower evaporation rate since GaAs has a higher vapor pressure than AlGaAs. Higher evaporation rates require higher temperatures which begin to reach a point where damage to the crystal can occur, first, by steep thermal gradients in the film that stress the crystal and, secondly, by melting the material and possibly bring on ablation, all of which conditions are undesirable. For example, congruent evaporation of GaAs occurs around 950° C. in an attending ambient mixture of $AsH_3$ and $H_2$ (otherwise, at about 680° C. in a vacuum) and GaAs will begin to melt at about 1240° C.

For complete removal, for example, of a 90 Å to 100 Å thick quantum well spot of GaAs via a 3 mm diameter YAG laser beam with a power of about 5 W is going to take about 1.5 minutes of dwell time where combined temperature produced by substrate induction heating and beam intensity may be 1050° C. However, we have not obtained sufficient data to more accurately determine the range of evaporation enhancement for these particular conditions. In any case, the greater the substrate/beam spot temperature difference due to higher laser power, the greater will be the evaporation enhancement rate.

During the evaporation enhancement, an attending ambient gas mixture is generally flowing through chamber 11 to remove byproducts of the evaporation process and help maintain equilibrium in the evaporation mechanism. In the case of GaAs, for example, upon the completion of film growth, the TMG source is extinguished and $AsH_3$ and $H_2$ sources are continued during photo induced evaporation enhancement.

Although foregoing discussion has been described in connection with semiconductors of GaAs and GaAlAs regime, other III-V alloys may be employed in the practice of this invention, such as, InGaP, InGaAsP, GaAlAsP, InGaAlP, InGaAlAsP, GaAlSb and other alloy regimes may be utilized in the practice of the invention, such as, II-VI materials, e.g., ZnSe, ZnSSe and CdS. Also, Group IV materials, most importantly Si and Ge, may be utilized in the practice of this invention.

The principal mechanism desired in photo induced evaporation enhancement is heat absorbed at the growth surface. We presently believe, although not finally confirmed by experiment, that in order to obtain a more pure photothermal process with laser beam sources, it is desired to move away from UV and short wavelength radiation because the high photon energies of these high peak power, short wavelength radiation sources will drive the process into the realm of photochemical processes. Such processes will cause chemical bond breaking on the molecular scale at the surface and, with sufficient heat, bring about a form of surface ablation, which is not the objective of this invention. Ablation effects are not desired because the process of ablation involves the removal of fragments of material producing abrupt interfaces with surrounding material rather than a sculpturing effect with gradual spatial changes in the material into surrounding material.

Also, with the progression from longer wavelengths to shorter wavelengths, there is a point at which absorption of heat into the growth surface will begin to increase fairly rapidly and continues to increase as the wavelength becomes shorter. It is also advantageous in the enhancement method of this invention to proceed toward longer wavelengths to increase the depth of penetration of heat into the film bulk which produces a gradual thermal gradient through the film bulk or thickness (e.g., several Å up to 2 μm) and, therefore, the thermal gradient produced will not induce crystal damage related to thermal expansion differential. Thus, considerations in the practice of this invention must be given to tailoring the wavelength of the laser source to cause an efficient absorption of energy into the film bulk without induced damage.

This approach of deep absorption and extended thermal gradient in the film bulk provides for a very gentle evaporation process in terms of localized heating of a selected region of the film. When employing shorter wavelengths, the heat is absorbed primarily at the surface with a steep thermal gradient through the film thickness. Such a heating gradient is more proper for predominantly ablative and photochemical processes. Our experiments to date demonstrate that Ar+laser ($\lambda=0.5$ μm) and YAG laser ($\lambda=1.6$ μm) sources function properly for evaporation enhancement, but the YAG laser is possibly more preferred because of its longer wavelengths. Provided that there is sufficient power level (e.g., as a limited example, 5 W-50 W). Sufficient power levels may be obtained by the alignment of two laser beams 26 from source 27, which we have accomplished with a combination Ar+laser and YAG laser.

Beside considerations of source wavelengths, there is also considerations of laser intensity, power density or fluence, and dwell time at a particular surface location or spot. The amount of material evaporated from a deposited film is a function of the dwell time of the beam at a location and the optical power absorbed at the film surface. There is also the influence of the focus of laser spot size. Our experiments to date have spot sizes in the range of 35 μm-4 mm. As the laser beam is focussed down to smaller spot sizes, the area of the spot size changes as the square of the spot diameter and the evaporation rate varies exponentially in relationship to spot intensity temperature (see T. Kojima et al, supra) so that small changes, therefore, in spot size make for large changes in evaporation rate enhancement. Thus, a small decrease in beam spot size at the growth surface, e.g., 10%, will provide a much larger increase in evaporation enhancement, e.g., 40%.

Figure 5:
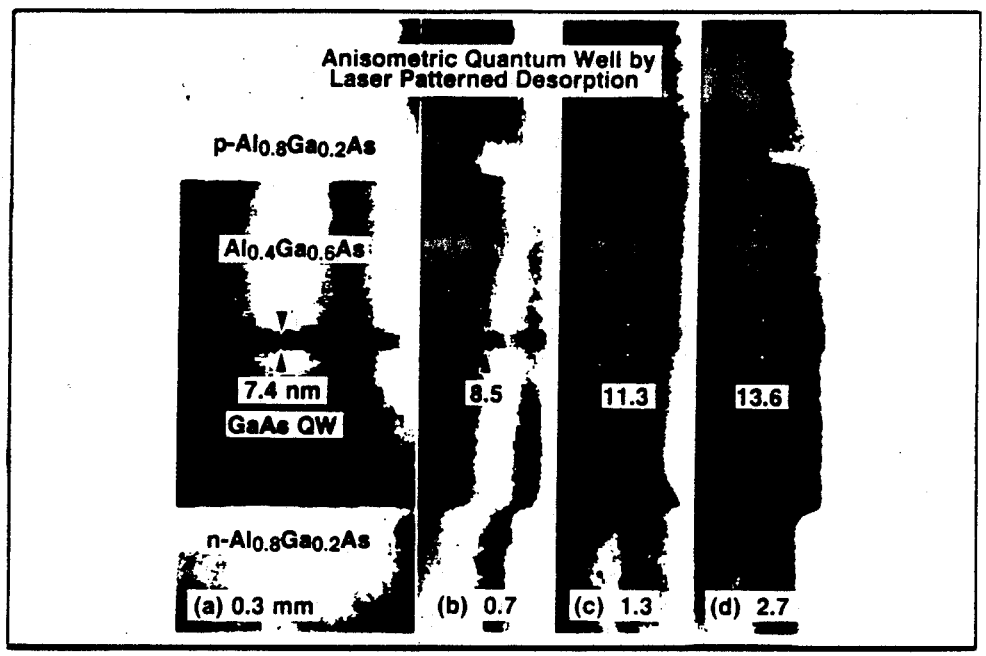
FIG. 5 is a TEM micrograph image of the waveguide region of a wafer grown heterostructure exemplifying the method of this invention in Example I.

It should be readily understood by this time that in relation to FIG. 5 in patent application Ser. No. 07/177,563, the growth rate enhancement curves shown as dotted lines for GaAs and AlGaAs in that Figure for substrate temperatures, $T_S$, below about 700° C. illustrate the previously discussed growth rate enhancement regime. This application deals with the evaporation enhancement regime comprising an extension of the growth rate enhancement curve to substrate temperatures, $T_S$, above about 800° C., which extends and then drops rapidly at about 825° C. for GaAs in a manner opposite to that of the positive enhancement mode illustrated in FIG. 5, i.e., it represents a negative enhancement mode and functions to provide film evaporation if there is no growth concurrently occurring, or functions to be subtractive of the established growth rate, if there is film growth occurring, to produce a resultant lower growth rate. The forgoing can be expressed as follows:

$$GR = D(T) - E(T) \text{ and } GRE = \frac{D_{ILL} - E_{ILL}}{D_{NONILL} - E_{NONILL}}$$

where GR is the growth rate (μm/min), GRE is the growth rate enhancement, D(T) is the gross deposition rate per unit time of the film for given conditions and E(T) is the evaporation rate per unit time for the same given conditions. The growth rate enhancement, GRE, is the ratio of the difference between the deposition rate and evaporation rate as enhanced by laser beam illumination (ILL=illumination) over the difference between the deposition rate and evaporation rate as not enhanced by laser beam illumination (NONILL=nonillumination). Note that with the definitions given here, the growth rate is the difference between deposition and evaporation rate. Thus, the growth rate, GR, will be enhanced optimally if one is operating in the region below about 610° C. where E(T) is practically zero, and D(T) is kinetically limited as taught in FIG. 5 in patent application Ser. No. 07/177,563. However, operating above about 800° C., where D(T) does not increase further because of limitations in the transport rate of reactants to the surface, and E(T) is exponentially increasing, the growth rate, GR, will begin to fall as E(T) becomes a larger factor, i.e., E(T)≃D(T) so that with illumination increasing the surface temperature there results a GRE less than one. If the deposition rate is zero or less than the evaporation rate in the case of illumination, GRE will become a negative value of enhancement.

The byproduct of the monolayer removal of material from irradiated spots of the growth surface are carried away by the environmental gases flowing in this system. In our current work, during film growth this would be accomplished by the pyrolyzed gases flowing away from the susceptor region 15 or, in the case after growth, the use of a continuous flow of $AsH_3/H_2$ attending ambient through reactor chamber 11. It is belived that the As flux in the attending ambient functions, during evaporation enhancement, as an As source for As evaporating from the film surface, which evaporation is occurring at faster rate than Ga, and provides an equilibrium balance in the evaporation process, i.e., provides for a As-stablized surface. The net effect is congruent evaporation of GaAs without leaving behind Ga droplets so that these Ga and As constituents are carried away by the flow of the $AsH_3/H_2$ attending ambient. In the case of evaporation enhancement of InGaP or InSb, for example, the attending ambient may respectively be phosphine or $H_3Sb$. In the case of the evaporation enhancement of II–VI compound films, such as ZnSe and CdS, the attending ambient may respectively be $H_2Se$ and $H_2S$. In all these cases, the concentration of the ambient source gases would be adjusted such that the evaporation process would be congruent or the net evaporation effect of each evaporating species would be equal, i.e., equilibrium in the evaporation process would be sustained.

While the method of evaporation enhancement has been discussed in connection with the presence of an attending ambient, our work shows that the process is also operative without such an environment, as in the case with a inert gas environment, although the uniform application of the process is not so significantly pronounced.

Figure 9:
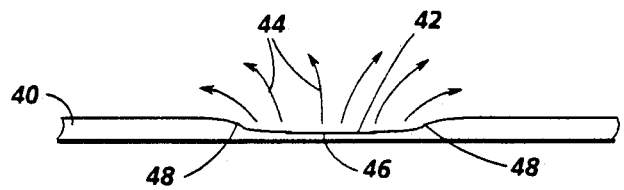
FIG. 9 is a schematic representation of a film layer being deposited or after its deposition wherein selective thinning geometry of the film is accomplished in situ utilizing photo induced evaporation enhancement of this invention.

FIG. 9 represents a single semiconductor film 40 after growth within the MOCVD system of FIG. 1. The beam 26 which has an intensity profile of Gaussian shape is focussed onto the surface of film 40. As an example, the beam spot at the surface of the film may be 2 or 3 mm in diameter. The beam may then be oscillated or vibrated in a linear direction by scanner 28 to produce an oval shaped spot of exposure on the film surface having an intensity profile of the same oval configuration. The beam may remain stationary forming a oval shaped groove 42 in film 40 or may be scanned in a straight-line direction, such as, out of the plane of FIG. 9 to form an elongated trough 42 in the film surface. Depending upon the dwell time and desired extent of material removal, a profile 42 of selected depth may be produced in the surface of film 40. Arrows 44 represent the byproduct of material evaporating from the surface of film 40 during evaporation enhancement. Because of the resultant changing intensity along the elongated profile of beam 26, the evaporation profile will substantially correspond to the same profile forming a thinning region 42 having a concaved bottom surface 46 with sloping edges 48. Thus, it is possible with the method of this invention to produce thinned film regions having a profile with monotonically increasing and decreasing thickness with desired edge tapering by providing a beam 26 with a substantially corresponding profile or by modifying the beam profile such as with high oscillation or vibration or with masking techniques.

As a specific example, film 40 may be a single quantum well having an original thickness of 100 Å with a thinned region 42 having a a continuous spatial variation in thickness from regions 48 to center 46 produced by photo induced evaporation enhancement via Gaussian shaped beam 26 with a final center thickness at 46 of 80 Å. The thinner quantum well exhibits a greater energy bandgap consistent with the quantum size effect. Because of the spatial patterning of the energy bandgap laterally along film 40, it is possible to provide in the 3 mm extent of region 42 a plurality of laser emitters of varying emission energy and correspondingly different wavelengths of operation, as illustrated in the following Example I.

The following Example I is a specific example of the foregoing method of photo induced evaporation enhancement. This particular Example is for the purpose of clarity of a method of utilizing photo induced evaporation enhancement after epitaxial growth that may be employed in carrying out the objects of this invention and is not intended nor should be construed to limit the invention to any particular form of enhancement as discussed herein because each chosen semiconductor compound and chosen irradiation source or sources will require initial determination of parameters for the chosen method, such as growth rate enhancement temperature, overpressure, gas constituent ratios, substrate temperature, etc.

EXAMPLE I

In our method, the patterned evaporation of GaAs is demonstrated by using combined Ar+ and Nd:YAG laser beams to locally heat the surface of a GaAs-AlGaAs heterostructure in a MOCVD reactor of the type shown in FIG. 1. The photo induced evaporation enhancement is applied to a buried layer, in particular, the quantum well (QW) active layer, within a GaAs-AlGaAs heterostructure. The thinning of the quantum well enhances the quantum size effect and thus spatially patterns the energy bandgap of the quantum well. The emission wavelength of laser diodes fabricated from the laser heated portion of the crystal correlate with the energy bandgap profile experienced by the evaporation enhancement. As practiced here, photo induced evaporation enhancement does not compromise the quality of the crystal and permits the fabrication of high quality multiple-wavelength laser diode bars.

The growth of the GaAs-AlGaAs heterostructures is performed in an atmospheric pressure inverted chimney chamber 11 in FIG. 1. In chamber 11, the GaAs substrate faces downward and is held against the lip of the quartz cup holder 15 by the weight of graphite susceptor 12. Susceptor 12 is inductively heated with external RF coil 16 to the temperature, $T_S$. As previously explained, dual gas inlets 18, 20, 22 and 24 are located near the optical window flat 13 at the bottom of chamber 11. Window 13 provides clear optical access for the CW Ar+ and Nd:YAG laser beams. The Ar+ laser is operated in the TEM$_{00}$ mode, single line at 514.5 nm with a power output of 2.4W. The Nd:YAG laser is a multi-mode beam with a 5.0W output. The lasers are aligned to coincide on the surface of the sample to provide maximum increase in the heterostructure surface temperature. As previously indicated, photo induced evaporation enhancement appears to be a purely thermal process and the experimental results are not attributed to the combination of visible and infrared radiation. In this connection, similar effects have been observed using only the Nd:YAG laser or only the Ar+ laser as a photothermal source.

To evaluate the effect of photo induced evaporation enhancement and to demonstrate a potentially useful device, the process is applied to the quantum well within a separate confinement double heterostructure laser, which laser structures are well known in the art. The transmission electron microscope (TEM) cross section of the waveguide region of a separate confinement double heterostructure laser is shown in FIG. 5 at four different positions relative to the 3 mm diameter laser beams, i.e., at four positions along the laser spot desorbed region of the sample. The quantum well thickness and distance, respectively, from the spot center are as follows: (a) 7.4 nm; 0.1 mm, (b) 8.5 nm; 0.7 mm, (c) 11.3 nm; 1.3 mm and 13.6 nm; 2.7 mm. The TEM technique used is corner incidence; the vertical bands in the micrograph are Fresnel fringes.

The crystal layers shown in FIG. 5 are all grown at the optimum temperature of 800° C. in MOCVD. These layers comprise, in order of growth, a Se doped GaAs buffer layer (0.3 $\mu$m thick), a Se doped Al$_{0.8}$Ga$_{0.2}$As lower confining layer (1.0 $\mu$m thick), an undoped Al$_{0.4}$Ga$_{0.6}$As waveguide layer (0.6 $\mu$m thick), a GaAs quantum well (13.6 nm thick).

After the growth of the GaAs quantum well, a 1% arsine/hydrogen mixture is introduced into reactor chamber 11. The substrate temperature, T$_S$, is increased to 825° C. and the combined laser beams focussed onto the growth surface. The laser spot is slightly "vibrated" by the galvanometer-controlled turning mirror 28 to spatially average any nonuniformity in the optical intensity. For 90 seconds the GaAs is evaporated from the GaAs surface at a greatly enhanced rate within the confines of the laser heated spot on the entrained surface. It is estimated that a temperature rise of about 200° C., i.e., from, 825° C. to approximately 1030° C., occurs at this entrained spot. Some negligible thinning of the quantum well film may occur in the field of the GaAs surface adjacent the laser spot but it is so insignificant as to not be readily discernible.

After 90 seconds, the substrate temperature, T$_S$, is returned or reduced to 800° C. and the growth of the structure is resumed. The remaining layers deposited are another Al$_{0.4}$Ga$_{0.6}$As waveguide layer (0.6 $\mu$m thick), a Mg doped Al$_{0.8}$Ga$_{0.2}$As upper confining layer (0.9 $\mu$m thick), and a Mg doped GaAs cap layer.

Figure 6:
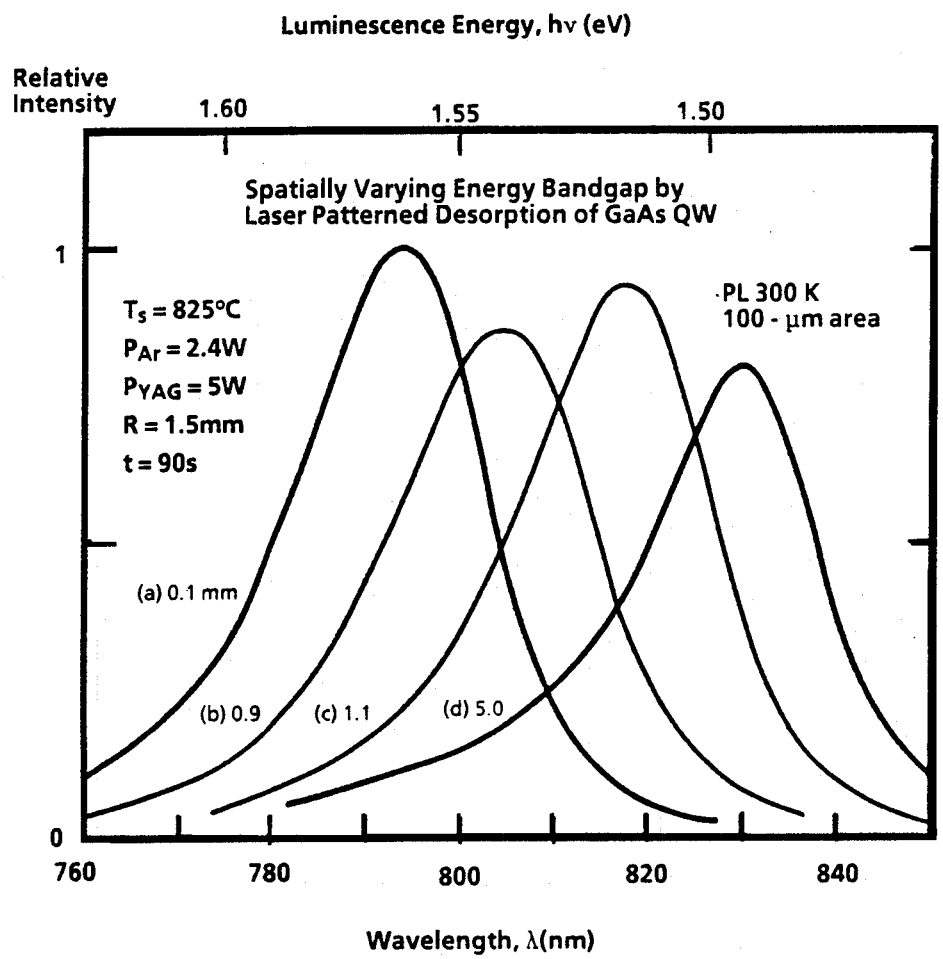
FIG. 6 is an photoluminescent (PL) spectra from four positions along the laser patterned wafer in Example I.

In reference to FIG. 5, measurements disclose that 6.2 nm of GaAs has been evaporated at a rate of 1 monolayer per 4 seconds near the center of the GaAs surface previously entrained with the laser spot. As previously indicated, the temperature of this spot is roughly estimated to be at a temperature of about 1030° C. Of course, differences in the effective As overpressure would affect this estimation. Further, measurements indicate that the GaAs quantum well thickness gradually increases to (b) 8.5 nm at 0.7 mm from the center of the spot, (c) 11.3 nm at 1.3 mm distance from the center of the spot, and (d) 13.6 nm at 2.7 mm distance from the center of the spot. The 13.6 nm quantum well represents the field value. Note that the TEM magnification in FIG. 6 is nearly constant so that the increase in waveguide size is mainly a result of the thicker quantum well. A more complete picture of the well size is given in the electroluminescence data discussed below. Samples produced from the structure examined with TEM indicate no disruption of the crystal quality at the point of photo induced evaporation.

In FIG. 6, the room temperature photoluminescence (PL) spectra from four positions along the wafer of FIG. 5 demonstrate the variation in the energy bandgap. A low power stationary Ar+ laser beam is used to excite the sample and each spectrum represents an average over a 100 $\mu$m area. The distance from the spot center and the emission maxima, respectively, are as follows: (a) 0.1 mm; 792 nm, (b) 0.9 mm; 805 nm, (c) 1.1 mm; 819 nm and (d) 5.0 mm; 831 nm. The increase in photon energy corresponds to the enhanced quantum size effect of the laser evaporation enhanced GaAs quantum well.

Curve (a) in FIG. 6 is the spectrum near the center of the laser spot. The emission maximum at 792 nm approximately corresponds to the 7.4 nm GaAs quantum well of FIG. 5 above. Curves (b) and (c) in FIG. 6, drawn with a lighter line, are spectra in the graded part of the GaAs quantum well.

The PL intensities are fairly constant and are not indicative of problems in crystal quality. In curve (d) in FIG. 6, the PL spectrum of the field is shown for the position 5 mm from the spot center, which is out of the field of the laser spot. The emission peak of 832 nm is consistent with the originally grown 13.6 nm thick quantum well.

Figure 7:
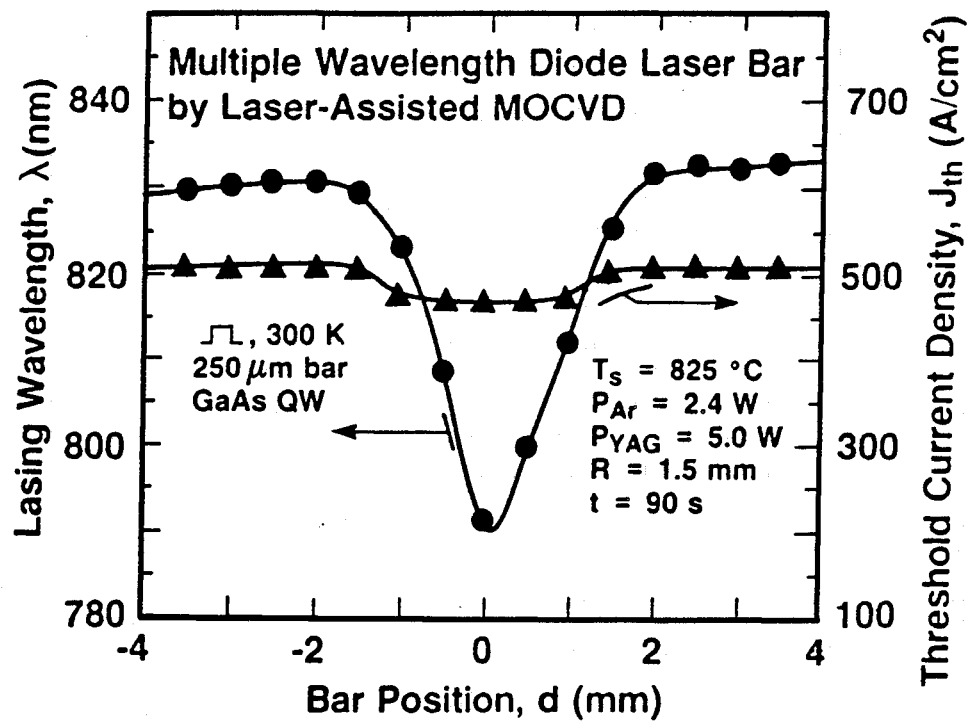
FIG. 7 is a graphical representation of lasing wavelength and threshold current density as a function of position along the wafer in Example I.

After the above PL testing was conducted, several bars obtained from the wafer are processed in conventional fashion into several broad area lasers. After the cm-long bars are cleaved, each broad area laser is electrically isolated with shallow saw cuts perpendicular to the laser facets. Each broad area laser is 250 $\mu$m wide and 250 $\mu$m long. The threshold current and emission wavelength as a function of position along a wafer bar are shown in FIG. 7. The size of the evaporated or desorbed region corresponds to the spot size of the laser beam upon the sample. The slight decrease in threshold current density in the laser spot is a result of better optimization of the quantum well laser structure. The decrease in lasing wavelength corresponds to the reduction in the thickness of the quantum well.

Similar to the PL data in FIG. 6, the emission wavelength indicates a decrease to 792 nm in the center of the region of the illuminated spot from the 830 nm emission in the field outside the region of the illuminated spot. The graded active regions of the different laser devices lase at different intermediate wavelengths therebetween. The threshold current density varies from 500 A/cm$^2$ in the field outside the spot to 480 A/cm$^2$ in the center of the laser spot. Experience with several wafers, some with AlGaAs quantum wells as active regions, indicate that the photo induced evaporation enhancement process does not increase threshold current, but rather the structure and growth conditions are not yet fully optimized to provide threshold current densities in the 300 A/cm$^2$ range. The data points in FIG. 7 represent every other device produced therefrom selectively along the length of the wafer bar. To be noted is that eight or more individually addressable wavelengths are obtainable from one half of a wafer bar. The shape of the wavelength shift is a reasonable representation of the expected intensity profile. More recent data indicates that thermal spreading does not dominate until below 50 μm spot diameter. The slight shift in threshold indicates that the optimum quantum well size is less than 13.6 nm and that no significant degradation in crystal quality has occurred. In fact, the evaporation process is most likely preferable to the 90 second purge exposure. The intensity versus current curves produced from the operation of these laser devices are well behaved with a sharp turn on and a reasonably constant slope.

Figure 8:
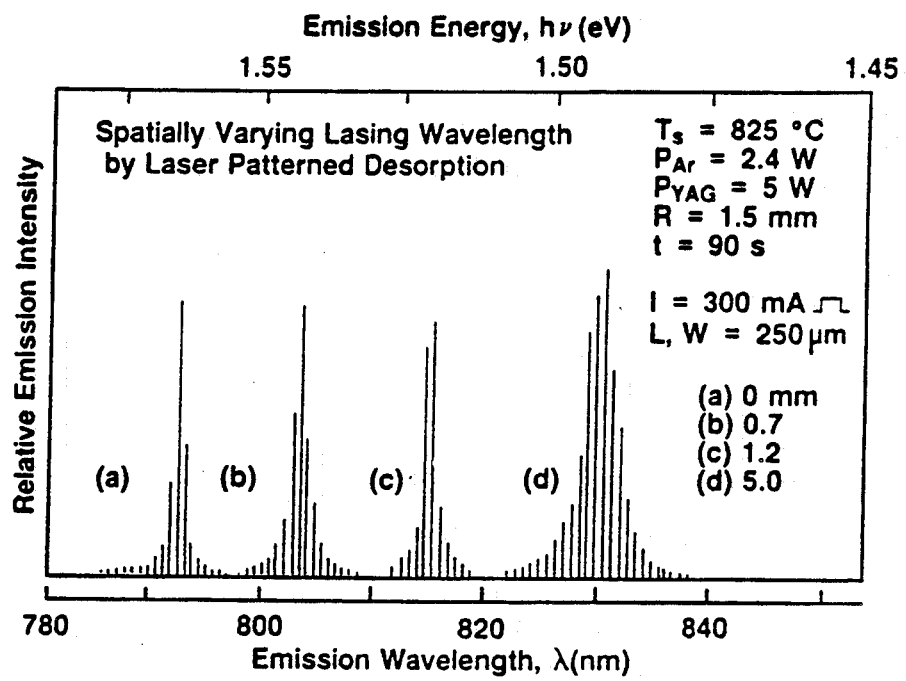
FIG. 8 is the emission spectra of four individual laser devices along a bar from the wafer of the heterostructure configuration shown in FIG. 5.

The emission spectra of four of the fabricated laser devices along a wafer bar are shown in FIG. 8. This data was taken under pulsed excitation at a current of 300 mA applied to each device. CW operation would require either current confinement striping or heat sinking. The data in FIG. 8 has been scaled to correct for the varying threshold currents. The devices represented by profiles (a) and (d) operate with a single set of modes across the device. However, the laser devices fabricated from the graded regions show some tendency to operate at two sets of modes displaced in center wavelength as expected from the gradient of FIG. 7. The devices are oriented perpendicular to the slits so that one set of modes are spatially filtered. The wide spectral separation of the individually addressable lasers indicate the potential application of these devices to wavelength multiplexed communication sources.

Reference is now made to various further possible geometries and structure configurations utilizing the method of this invention and are illustrated in FIGS. 10-16.

Figure 10A:
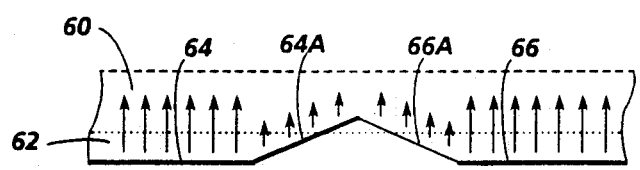
FIGS. 10A and 10B are schematic illustrations of thinning geometries in a selected region of a film which are the antithesis of the profiles illustrated in FIGS. 9A and 9B.
Figure 10B:
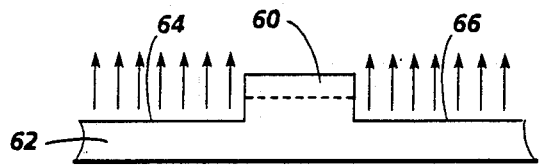
Figure 11:
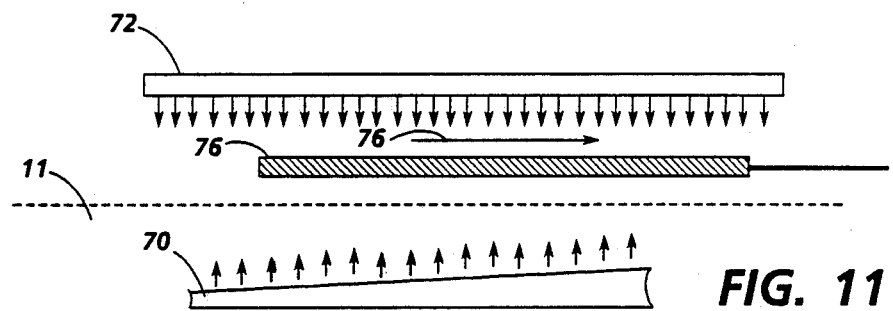
FIG. 11 is another schematic representation of a thinning geometry in a selected region of a film according to the teachings of this invention.

FIGS. 10 and 11 represent embodiments where the beam profile is modified to provide thinned regions in the film which are surface linear changes or surface abrupt changes in the thinning profile. This may be accomplished with the use of special optics at the position of lens 15 in FIG. 1 or by the use of a beam 26 with linearly changing intensity profile or linearly changing dwell time or a combination thereof.

Figure 9A:
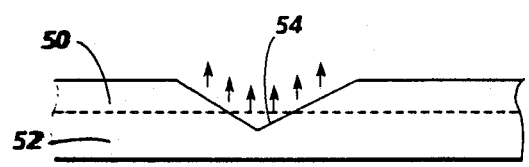
FIGS. 9A and 9B are schematic illustrations of thinning geometries in a selected region of a film formed by changes in the irradiation profile.
Figure 9B:
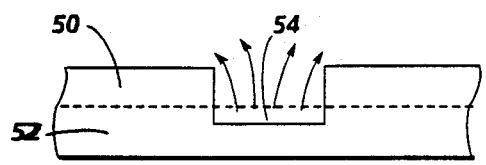

In FIGS. 9A and 9B, the film 50 is illustrated as having been deposited on an underlaying layer or support 52. A region 54 of film 50 is removed by means of evaporation enhancement in chamber 11 wherein the arrows represent the evaporation of monolayers and constituents of semiconductor material. In both Figures, the evaporation is shown extended into underlying support 52, although the evaporation etching process can be limited to the confines of film 50. The V-shaped linear slope in FIG. 9A is obtained by a beam tightly focussed and scanned with changing dwell time. In the case of FIG. 9B, the beam is formed to be a broadly focussed line source of substantially uniform intensity cross section. This may be accomplished by masking the edges of the beam or through the use of optics as known in the art. The resultant thinning profile in film 50 is a circular divot or well, if a stationary beam is employed or a V-shaped groove or vertical wall trough, if a linearly scanned beam is employed. The structures of FIG. 9 have great utility in semiconductor devices in providing internal current or optical waveguiding properties within the semiconductor structure useful for device operation.

FIGS. 10A and 10B are the antithesis of the geometry profiles shown respectively in FIGS. 9A and 9B. Film 60 is illustrated as having been deposited on underlaying layer or support 62. Regions of film 60 above surfaces 64, 64A, 66A and 66 are removed by means of evaporation enhancement in chamber 11 wherein the arrows represent the evaporation of monolayers and constituents of material. In both Figures, the evaporation is shown extended into underlying support 62 leaving only a small portion of the original film 60, although the evaporation etching process can be limited to the confines of film 60. The V-shaped linear slope at 64A and 66A in FIG. 10A is obtained by a beam tightly focussed with changing dwell time. Regions 64 and 66 are obtained by stationary beam exposure or a repetitiously scanned beam over the film surface. Regions 64 and 66 may also be formed by a broadly focussed line source of substantially uniform intensity cross section. This may be accomplished by masking the edge regions of the beam or through the use of optics as known in the art. The resultant thinning profile in film 60 is a circular dimple or mesa, if a stationary beam is employed or a V-shaped elongated mesa or a vertical wall mesa, if a linearly scanned beam is employed.

The structure of film 70 in FIG. 11 has been previously referred to above relative to its linear profile. The importance of this monotonically sloped surface profile in semiconductor devices, for example, is the fabrication of linear laser arrays having multiple emitters wherein film 70 would provide monotonic changes in the quantum size effect across film 70 useful in providing a plurality of laser emitters each having a different wavelength of operation as illustrated relative to Example I.

The linear profile of film 70 may be accomplished by the use of special optics, by scanning beam 26 across the film surface with monotonically changing intensity or with monotonically changing dwell time or a combination of both. Also, this linear sloping profile may be produced with the employment of a stationary linear line source 72 of substantially uniform intensity with a mask 74 slowly moved in the direction of arrow 76 during the time of exposure thereby producing a monotonically increasing thermal gradient exposure of the beam to film 70 starting at the left edge of film 70 as viewed in FIG. 11.

Figure 12:
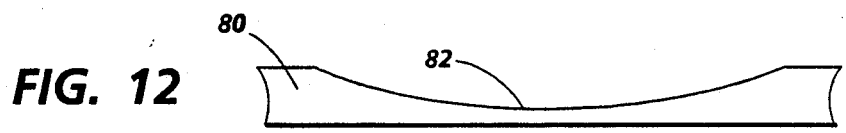
FIG. 12 is a further schematic representation of a thinning geometry in a selected region of a film according to the teachings of this invention.
Figure 13:
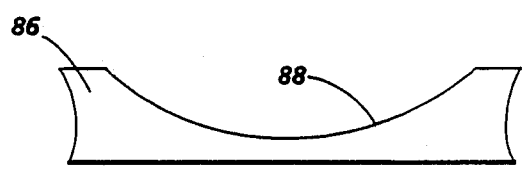
FIG. 13 is a schematic representation of a thinning geometry in a selected region of a film having a similar geometry to that shown in FIG. 12 but with different profile.
Figure 14:
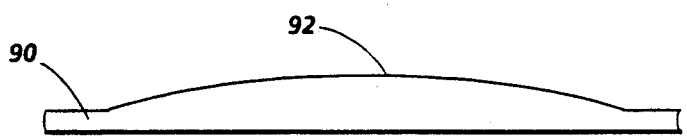
FIG. 14 is a schematic representation of a thinning geometry in a selected region of a film having geometry which is the inverse of that shown in FIG. 12.

FIGS. 12, 13 and 14 represent other film profiles possible in the practice of this invention wherein the thinned region takes on the profile of the beam intensity profile. As an example, film 80 in FIG. 12 has a thinned region 82 of concaved shaped, slow lateral tapered variation as compared to film 86 in FIG. 13 which has a thinned region 88 of concaved shaped, fast lateral tapered variation. The variation of the rapidity of profiles 82 and 88 is accomplished with beam profiles modified to have corresponding intensity profiles which can be accomplished by field of depth focussing and with optics.

FIG. 14 is the antithesis of FIG. 12 wherein film 90 has a convex shaped, slow lateral tapered variation 92 formed by a beam tightly focussed with a changing dwell time or with a changing intensity variation that linearly cycles between a maximum level of time or intensity and a minimum level of time or intensity. Film 90, therefore, is thickest in the center of profile 92 wherein the minimum level of time or intensity has been maintained during scanning operation of the beam.

Figure 15:
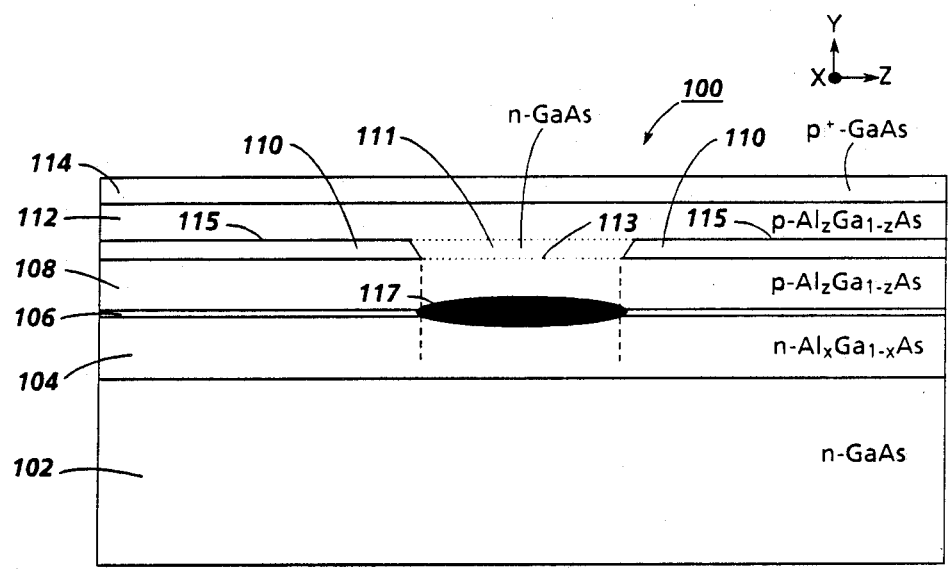
FIG. 15 is a schematic illustration of a lateral side elevation of a heterostructure laser with buried back biased current confinement formed by the method of this invention.
Figure 16:
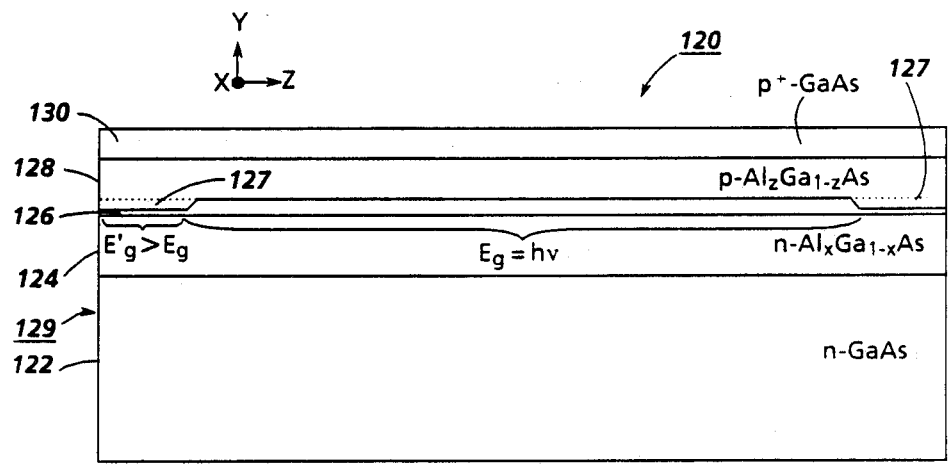
FIG. 16 is a schematic illustration of a longitudinal side elevation of a heterostructure laser with transparent window regions formed by the method of this invention.

FIGS. 15 and 16 illustrate two heterostructure lasers fabricated in MOCVD employing photo induced evaporation enhancement of this invention. In particular, the heterostructure laser 100 in FIG. 15 is substantially identical to the laser structure shown in H. Tanaka et al, supra, except that by employing the method of this invention, the separate chemical out-of-situ chemically etching step is not necessary and no stop etch masking or other on-structure masking like that in A. C. Warren et al, supra, are required.

Laser 100 comprises a single emitter 101 comprising, for example, a substrate 102 upon which are deposited the following layers or regions employing the MOCVD reactor shown in FIG. 1: a cladding layer 104 of n-$Ga_{1-x}Al_xAs$; an active region 106 being undoped, or p-type doped or n-type doped and can comprise a relatively thin conventional double heterostructure (DH) active layer or a single quantum well of either GaAs or $Ga_{1-y}Al_yAs$ where y is very small and $x>y$ or a multiple quantum well structure of alternating well layers of GaAs or $Ga_{1-y}Al_yAs$ and corresponding barrier layers of either AlAs or $Ga_{1-y'}Al_{y'}As$, where x, $y'>y$ or a separate single or multiple quantum well structure in a separate confinement cavity; a cladding layer 108 of p-$Ga_{1-z}Al_zAs$ where x, z, $y'>y$; a n-GaAs layer 110 followed by another cladding layer 112 of p-$Ga_{1-z}Al_zAs$, which is an extension of layer 108 and, finally cap layer 110 of p+ GaAs. Fabrication of these layers is continuous through the growth of layer 110 at which time epitaxial growth is interrupted, the TMG source to chamber 11 is turned off, the substrate temperature is increased to 825° C. and beam 26 is focused to an elongated region 111 of layer 110 and scanned in the X direction out of the plane of FIG. 15 for a period of time, e.g., at 1 Å/second, sufficient to thermally evaporate region 111 to the interface 113 at layer 108. The temperature at region 111 during the evaporation process in the As/H attending environment may be about 1000° C. to 1030° C. After the removal of GaAs region 11, epitaxial growth is continued with the deposition of layers 112 and 114. The p-$Ga_{1-z}Al_zAs$ region 11 through n-GaAs film 110 forms a reverse biased p-n junction 115 to provide for current confinement to active region 117 of laser 100. Appropriate proton bombardment and metallization may then be performed at the outer surfaces of layer 114 and substrate 103 as is known in the art. Thus, the processing provided by this invention permits the full in situ processing of buried 3-D geometrical configurations in semiconductor devices without any removal from or movement of the semiconductor structure in chamber 11.

Laser 120 in FIG. 16 is known in the art as window laser and may be comprised of one or more adjacently disposed emitters. Laser 100 comprises a substrate 122 upon which are deposited the following layers or regions employing the MOCVD reactor shown in FIG. 1: a cladding layer 124 of n-$Ga_{1-x}Al_xAs$; an active region 126 being undoped, or p-type doped or n-type doped and can comprise a relatively thin conventional double heterostructure (DH) active layer or a single quantum well of either GaAs or $Ga_{1-y}Al_yAs$ where y is very small and $x>y$ or a multiple quantum well structure of alternating well layers of GaAs or $Ga_{1-y}Al_yAs$ and corresponding barrier layers of either AlAs or $Ga_{1-y'}Al_{y'}As$, where x, $y'>y$ or a separate single or multiple quantum well structure in a separate confinement cavity; a cladding layer 128 of p-$Ga_{1-z}Al_zAs$ where x, z, $y'>y$; and a cap layer 130 of p+ GaAs. Fabrication of these layers is continuous through the growth of layer 126 at which time epitaxial growth is interrupted, the TMG source to chamber 11 is turned off, the substrate temperature is increased to 825° C. and beam 26 is focused to an elongated region 127 at both ends of layer 126 and scanned in the X direction out of the plane of FIG. 16 for a period of time, e.g., at 1 Å/second, sufficient to thermally evaporate a portion of layer 126 in regions 127. The temperature at region 127 during the evaporation process in the As/H attending environment may be about 1000° C. to 1030° C. After the removal of a portion of GaAs regions 127, epitaxial growth is continued with the deposition of layers 128 and 130. Thinned regions 127 form transparent, passive waveguides which are nonabsorbing to propagating radiation to mirror facets 129.

In conclusion, a new laser patterning technique is demonstrated and is capable of thinning down thin films of compound semiconductors to, inter alia, spatially modify the energy bandgap of the crystal. Some of the applications for such a device, i.e., a multiple-wavelength laser based on the same effect, include communications involving wavelength multiplexing, continuously tunable spectroscopic sources, and unique forms of multiple wavelength detectors.

While the invention has been described in conjunction with a few specific embodiments, it is evident to those skilled in the art that many alternatives, modifications and variations will be apparent in light of the foregoing description. For example, while the use of an electron or ion beam sources have not been discussed herein, it is within the scope of this invention to apply them as alternative sources for supplying the level of heat necessary to the growth surface to perform the photo induced evaporation enhancement of this invention. However, such process employing either of these types of beams as a heat source would be limited to after film growth usage since an electron beam would require a vacuum and, further, an ion beam usage would require reduced pressure in the system below several millibar. Also, this method may be practiced in MBE with beam exposure of the growth surface from outside the MBE chamber. Accordingly, the invention is intended to embrace all such alternatives, modifications and variations as fall within the spirit and scope of the appended claims.

What is claimed is:

1. A method of thermal patterning providing sculptured thinning of selected regions in a semiconductor film while in situ during or after its epitaxial growth comprising a compound semiconductor, said method comprising:

maintaining the temperature thereof below that required for initiating thermal evaporation of the constituents comprising said compound semiconductor, said temperature determined in part by the attending ambient surrounding said film, irradiating said selected regions of said film with a beam having sufficient fluence to thermally elevate the temperature of said selected regions above a crossover point to cause thermal evaporation of said compound semiconductor in said selected regions, and continuing said beam irradiation continuously or repetitively for a sufficient period of time in said selected regions thereby evaporating said compound semiconductor therein to a desired depth.

2. The method of thermal patterning of claim 1 including the step of configuring the intensity profile of said beam to match the desired geometrical thinning configuration desired in said selected regions.

3. The method of thermal patterning of claim 2 wherein said beam profile is substantially Gaussian in shape.

4. The method of thermal patterning of claim 2 wherein said beam profile is a line source of substantially uniform intensity.

5. The method of thermal patterning of claim 1 wherein said compound semiconductor is a III–V compound and said attending ambient is $As_2$, $PH_3$ or $H_3Sb$.

6. In the thin film fabrication method of claim 1 wherein the step of irradiating is carried out during the step of epitaxial deposition said compound semiconductor.

7. In the thin film fabrication method of claim 1 wherein the step of irradiating is carried out after the step of epitaxial deposition said compound semiconductor.

8. A semiconductor device comprising a plurality of semiconductor layers wherein at least one of said layers is treated in situ during growth of said device according to the method of claim 1.

9. In a thin film fabrication method utilizing photo induced evaporation enhancement in epitaxial growth of a semiconductor structure comprising the steps of:

providing a chemical vapor deposition system having a reactor chamber, introducing reactant gases into said reactor chamber having deposition components therein, supporting a substrate in said reactor chamber with a major growth surface thereof positioned for receiving said components, depositing compound film on said support through the pyrolysis of said reactant gases, irradiating in situ selected regions of said film with a beam having sufficient power density and dwell time to change the thickness of said deposited film in said selected regions by removing all or portions thereof via evaporation producing a pattern of film regions having a thinner thickness compared to other film regions, and thereafter continuing epitaxial growth over said in situ patterned film.

10. In the thin film fabrication method of claim 8 wherein the step of irradiating is carried out during the step of depositing said compound film.

11. In the thin film fabrication method of claim 8 wherein the step of irradiating is carried out after the step of depositing said compound film and before the step of continuing epitaxial growth over said in situ patterned film.

* * * * *